US009944831B2

(12) United States Patent
Morita et al.

(10) Patent No.: US 9,944,831 B2
(45) Date of Patent: Apr. 17, 2018

(54) HEAT-CONDUCTIVE ADHESIVE SHEET, MANUFACTURING METHOD FOR SAME, AND ELECTRONIC DEVICE USING SAME

(71) Applicant: LINTEC CORPORATION, Itabashi-ku (JP)

(72) Inventors: Wataru Morita, Saitama (JP); Kunihisa Kato, Warabi (JP); Tsuyoshi Mutou, Saitama (JP)

(73) Assignee: LINTEC CORPORATION, Itabashi-ku (JP)

(*) Notice: Subject to any disclaimer, the term of this patent is extended or adjusted under 35 U.S.C. 154(b) by 0 days.

(21) Appl. No.: 15/021,094

(22) PCT Filed: Sep. 24, 2014

(86) PCT No.: PCT/JP2014/075299
§ 371 (c)(1),
(2) Date: Mar. 10, 2016

(87) PCT Pub. No.: WO2015/046254
PCT Pub. Date: Apr. 2, 2015

(65) Prior Publication Data
US 2016/0215172 A1 Jul. 28, 2016

(30) Foreign Application Priority Data

Sep. 25, 2013 (JP) ................. 2013-198788

(51) Int. Cl.
| C09J 7/00 | (2006.01) |
| C09J 9/02 | (2006.01) |
| H01L 35/32 | (2006.01) |
| C09J 9/00 | (2006.01) |
| C09J 11/04 | (2006.01) |
| C09J 175/04 | (2006.01) |
| C09J 183/04 | (2006.01) |
| C09J 201/00 | (2006.01) |
| H01L 35/30 | (2006.01) |
| H01L 35/34 | (2006.01) |
| C08G 18/62 | (2006.01) |
| C08G 18/81 | (2006.01) |
| C08K 3/08 | (2006.01) |
| C08K 3/22 | (2006.01) |
| C08K 3/28 | (2006.01) |
| C08K 3/38 | (2006.01) |

(52) U.S. Cl.
CPC ............ *C09J 7/00* (2013.01); *C08G 18/6229* (2013.01); *C08G 18/6254* (2013.01); *C08G 18/8116* (2013.01); *C09J 9/00* (2013.01); *C09J 9/02* (2013.01); *C09J 11/04* (2013.01); *C09J 175/04* (2013.01); *C09J 183/04* (2013.01); *C09J 201/00* (2013.01); *H01L 35/30* (2013.01); *H01L 35/32* (2013.01); *H01L 35/34* (2013.01); *C08K 3/08* (2013.01); *C08K 3/22* (2013.01); *C08K 3/28* (2013.01);

*C08K 2003/385* (2013.01); *C08K 2201/001* (2013.01); *C09J 2201/40* (2013.01); *C09J 2203/326* (2013.01); *C09J 2205/102* (2013.01); *C09J 2475/00* (2013.01); *C09J 2483/00* (2013.01)

(58) Field of Classification Search
CPC ................ C09J 7/00; C09J 9/02; H01L 35/32
See application file for complete search history.

(56) References Cited

U.S. PATENT DOCUMENTS

| 2007/0052903 A1 | 3/2007 | Kang et al. |
| 2009/0035566 A1 | 2/2009 | Huang et al. |

FOREIGN PATENT DOCUMENTS

| CN | 1396430 A1 | 2/2003 | |
| EP | 2 014 734 | * 1/2009 | ............ C08J 5/121 |
| EP | 2 014 734 A1 | 1/2009 | |
| EP | 2 058 903 A1 | 5/2009 | |
| EP | 3 035 397 A1 | 6/2016 | |

(Continued)

OTHER PUBLICATIONS

International Search Report dated Nov. 11, 2014, in PCT/JP2014/075299 filed Sep. 24, 2014.
Extended European Search Report dated Mar. 17, 2017 in Patent Application No. 14848514.7.
Combined Chinese Office Action and Search Report dated Jun. 1, 2017 in Patent Application No. 201480051534.5 (With English Language translation of categories of cited documents).

Primary Examiner — Robert Harlan
(74) Attorney, Agent, or Firm — Oblon, McClelland, Maier & Neustadt, L.L.P.

(57) ABSTRACT

The present invention provides a thermally conductive adhesive sheet that can be easily laminated on an electronic device without an adhesive layer therebetween and can further selectively dissipate heat in a particular direction to provide a sufficient temperature difference to the inside of the electronic device, a method for producing the same, and an electronic device using the same. The present invention includes a thermally conductive adhesive sheet comprising a high thermally conductive portion and a low thermally conductive portion, wherein the high thermally conductive portion and the low thermally conductive portion have adhesiveness, and the high thermally conductive portion and the low thermally conductive portion each independently constitute an entire thickness of the thermally conductive adhesive sheet, or at least either the high thermally conductive portion or the low thermally conductive portion constitutes a portion of a thickness of the thermally conductive adhesive sheet, and a method for producing the thermally conductive adhesive sheet, and an electronic device using the thermally conductive adhesive sheet.

20 Claims, 4 Drawing Sheets

(56) References Cited

FOREIGN PATENT DOCUMENTS

| | | | |
|---|---|---|---|
| JP | 8-70142 A | 3/1996 | |
| JP | 3981738 B | 9/2007 | |
| JP | 2008-182160 * | 8/2008 | ............ H01L 35/32 |
| JP | 2008-182160 A | 8/2008 | |
| JP | 2009-88117 A1 | 4/2009 | |
| JP | 2009-302168 A | 12/2009 | |
| JP | 2011-35203 A | 2/2011 | |

* cited by examiner

HEAT-CONDUCTIVE ADHESIVE SHEET, MANUFACTURING METHOD FOR SAME, AND ELECTRONIC DEVICE USING SAME

TECHNICAL FIELD

The present invention relates to a thermally conductive adhesive sheet and particularly to a thermally conductive adhesive sheet used in an electronic device, a method for producing the same, and an electronic device using the same.

BACKGROUND ART

Conventionally, a sheet-shaped heat-dissipating member having high thermal conductivity is used inside an electronic device or the like in order to release heat or control the flow of heat in a particular direction. Examples of the electronic device include thermoelectric conversion devices, photo-electric conversion devices, and semiconductor devices such as large scale integrated circuits.

Nowadays, in semiconductor devices, as the miniaturization and densification of the semiconductor devices, and the like proceed, the temperature of heat generated from the inside during operation becomes higher, and when heat dissipation is not sufficient, the properties of the semiconductor devices themselves decrease to sometimes cause malfunction, which may finally lead to the breakage or life decrease of the semiconductor devices. In such a case, as a means to efficiently dissipate, to the outside, heat generated from the semiconductor device, a heat-dissipating sheet having excellent thermal conductivity is provided between the semiconductor device and a heat sink (metal member).

In addition, in thermoelectric conversion devices among such electronic devices, studies of selectively controlling heat dissipation in a particular direction (efficiently providing a temperature difference to the inside of a thermoelectric element) using a sheet-shaped heat-dissipating member, which relate to the control of heat dissipation described above, have been made; because the obtained power increases when heat provided to one face of a thermoelectric element is controlled so that the temperature difference increases in the thickness direction inside the thermoelectric element. Patent Literature 1 discloses a thermoelectric conversion element having a structure as shown in FIG. 7. Specifically, a P-type thermoelectric element 41 and an N-type thermoelectric element 42 are connected in series; thermoelectromotive force extraction electrodes 43 are arranged at both ends thereof to constitute a thermoelectric conversion module 46; and film-shaped substrates 44 and 45 having flexibility composed of two types of materials having different thermal conductivities are provided on both faces of the thermoelectric conversion module 46. In the film-shaped substrates 44 and 45, materials having low thermal conductivity (polyimide) 47 and 48 are provided on the sides of the joining faces to the above thermoelectric conversion module 46, and materials having high thermal conductivity (copper) 49 and 50 are provided on the sides opposite to the joining faces of the above thermoelectric conversion module 46 so as to be positioned in portions of the outer faces of the substrates 44 and 45.

In addition, Patent Literature 2 discloses a thermoelectric conversion module having a structure shown in FIG. 8. Electrodes 54 also serving as high thermal conductivity members are embedded in low thermal conductivity members 51 and 52, and they are arranged on a thermoelectric element 53 via an electrically conductive adhesive layer 55 and an insulating adhesive layer 56.

Further, in Patent Literature 3, as shown in a cross-sectional configuration diagram of a thermoelectric conversion element (the arrangement of a thermoelectric element 61 in the depth direction and internal electrode arrangement are omitted) in FIG. 9, an insulating substratum layer 65 is arranged on one face of the thermoelectric element 61 via an adhesive layer 67; another insulating substratum layer 65 is directly arranged on the other face; and on the substratum layers 65, flexible substrates 62 and 66 having pattern layers comprising metal layers 63 and resin layers 64 are disclosed.

CITATION LIST

Patent Literature

PTL1: JP 3981738 B
PTL2: JP 2011-35203 A
PTL3: JP 2008-182160 A

SUMMARY OF INVENTION

Technical Problem

As described above, particularly, in electronic devices mainly including semiconductor devices, there is a need for a heat-dissipating sheet that can more efficiently dissipate heat to the outside, and a thermally conductive sheet having excellent thermal conductivity and further having the function of selectively dissipating heat in a particular direction to produce a temperature gradient inside the electronic device.

In view of the above problem, it is an object of the present invention to provide a thermally conductive adhesive sheet that can be easily laminated on an electronic device without an adhesive layer therebetween and can further selectively dissipate heat in a particular direction to provide a sufficient temperature difference to the inside of the electronic device, a method for producing the same, and an electronic device using the same.

Solution to Problem

The present inventors have studied diligently in order to solve the above object, and as a result found that the above object is solved by making a thermally conductive adhesive sheet which is composed of a high thermally conductive portion and a low thermally conductive portion provided with adhesiveness and in which the high thermally conductive portion and the low thermally conductive portion each independently constitute the entire thickness of the thermally conductive adhesive sheet, or at least either the high thermally conductive portion or the low thermally conductive portion constitutes a portion of the thickness of the thermally conductive adhesive sheet, thereby completing the present invention.

Specifically, the present invention provides the following (1) to (10).

(1) A thermally conductive adhesive sheet comprising a high thermally conductive portion and a low thermally conductive portion, wherein the high thermally conductive portion and the low thermally conductive portion have adhesiveness, and the high thermally conductive portion and the low thermally conductive portion each independently constitute an entire thickness of the thermally conductive adhesive sheet, or at least either the high thermally conductive portion or the low thermally con- (2) The thermally conductive adhesive sheet according to the above (1), wherein the high thermally conductive portion and the low thermally conductive portion are each formed of an adhesive resin composition.
(3) The thermally conductive adhesive sheet according to the above (2), wherein the adhesive resin composition comprises at least any one of a thermosetting resin and an energy ray-curable resin.
(4) The thermally conductive adhesive sheet according to the above (3), wherein the thermosetting resin is a silicone resin or a urethane resin.
(5) The thermally conductive adhesive sheet according to the above (2), wherein the adhesive resin composition of the high thermally conductive portion comprises a thermally conductive filler and/or an electrically conductive carbon compound.
(6) The thermally conductive adhesive sheet according to the above (5), wherein the thermally conductive filler comprises at least one selected from the group consisting of a metal oxide, a metal nitride, and a metal.
(7) The thermally conductive adhesive sheet according to the above (5), wherein the thermally conductive filler comprises a metal oxide and a metal nitride.
(8) The thermally conductive adhesive sheet according to the above (1), wherein a thermal conductivity of the high thermally conductive portion of the thermally conductive adhesive sheet is 1.0 (W/m·K) or more, and a thermal conductivity of the low thermally conductive portion is less than 0.5 (W/m·K).
(9) An electronic device using the thermally conductive adhesive sheet according to the above (1).
(10) A method for producing the thermally conductive adhesive sheet according to the above (1), comprising a step of forming on a release sheet a high thermally conductive portion formed of an adhesive resin composition and a low thermally conductive portion formed of an adhesive resin composition.

Advantageous Effects of Invention

The thermally conductive adhesive sheet of the present invention can be easily laminated on an electronic device without an adhesive layer therebetween and can further selectively dissipate heat in a particular direction to provide a sufficient temperature difference to the inside of an electronic device or the like. In addition, an adhesive layer is not required, and therefore the productivity of an electronic device is high, which results in low cost.

DESCRIPTION OF EMBODIMENTS

[Thermally Conductive Adhesive Sheet]

The thermally conductive adhesive sheet of the present invention is a thermally conductive adhesive sheet composed of a high thermally conductive portion and a low thermally conductive portion, wherein the high thermally conductive portion and the low thermally conductive portion have adhesiveness, and the high thermally conductive portion and the low thermally conductive portion each independently constitute the entire thickness of the thermally conductive adhesive sheet, or at least either the high thermally conductive portion or the low thermally conductive portion constitutes a portion of the thickness of the thermally conductive adhesive sheet.

Figure 1:
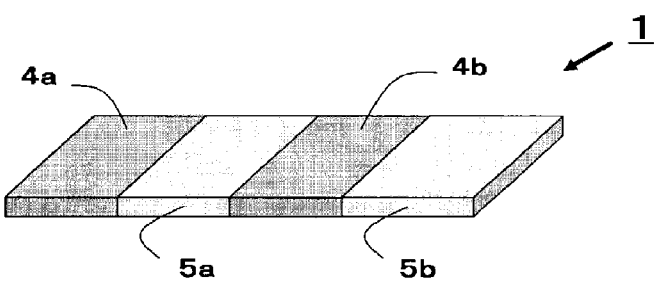
FIG. 1 is a perspective view showing one example of the thermally conductive adhesive sheet of the present invention.
Figure 2:
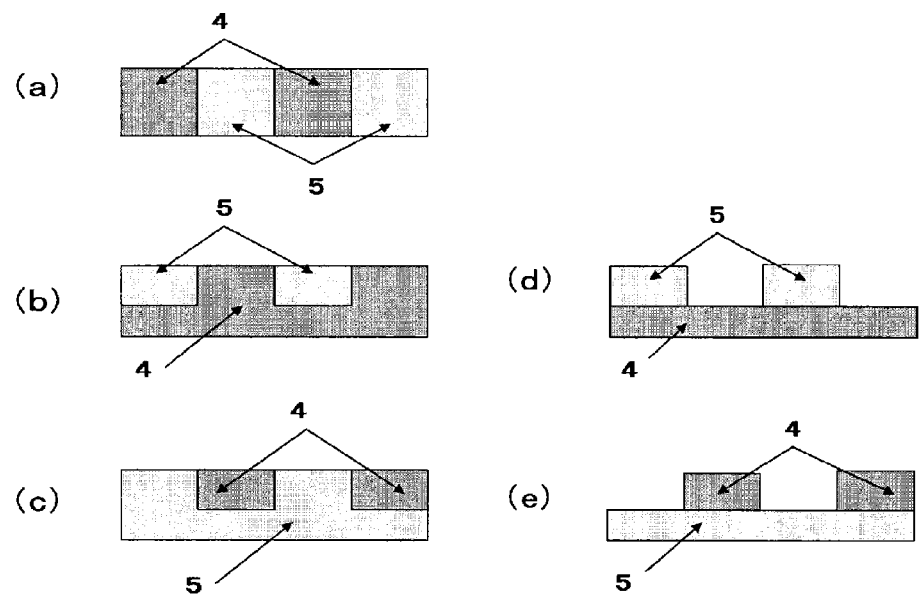
FIG. 2 shows cross-sectional views showing various examples of the thermally conductive adhesive sheets of the present invention.

The configuration of the thermally conductive adhesive sheet of the present invention, and the like will be described using the drawings.
FIG. 1 shows one example of a perspective view of the thermally conductive adhesive sheet of the present invention. A thermally conductive adhesive sheet 1 is composed of high thermally conductive portions 4a and 4b and low thermally conductive portions 5a and 5b, and they are alternately arranged. The arrangement of the high thermally conductive portions and the low thermally conductive portions constituting the thermally conductive adhesive sheet (hereinafter sometimes referred to as the configuration of thickness) is not particularly limited as described below.
FIG. 2 shows various examples of cross-sectional views (including arrangement) of the thermally conductive adhesive sheets of the present invention. The (a) of FIG. 2 is a cross-sectional view of FIG. 1, and the high thermally conductive portions 4 and the low thermally conductive portions 5 each independently constitute the entire thickness of the thermally conductive adhesive sheet. In addition, in the (b) and (d) of FIG. 2, the low thermally conductive portions 5 constitute a portion of the thickness of the thermally conductive adhesive sheet. Further, in the (c) and (e) of FIG. 2, the high thermally conductive portions 4 constitute a portion of the thickness of the thermally conductive adhesive sheet. The configuration of the thickness of the thermally conductive adhesive sheet can be appropriately selected in accordance with the specifications of an applied electronic device. For example, from the viewpoint of selectively dissipating heat in a particular direction, for example, the configurations of thickness in the (a) to (e) of FIG. 2 are preferably selected, and the configuration of thickness in the (a) of FIG. 2 is further preferred. In addition, from the viewpoint of efficiently dissipating, to the outside, heat generated from the inside of an electronic device, for example, the configurations of thickness in the (a) to (e) of FIG. 2 are preferably selected in accordance with the specifications of the electronic device. At this time, by adopting a configuration in which the volume of the high thermally conductive portion and also the contact area with the face of the applied device are large, heat dissipation can be efficiently controlled.

<High Thermally Conductive Portion>

The high thermally conductive portion is formed of an adhesive resin composition. The shape of the above high thermally conductive portion is not particularly limited and can be appropriately changed according to the specifications of an electronic device or the like described later. Here, the high thermally conductive portion of the present invention refers to one having higher thermal conductivity than that of the low thermally conductive portion described later.

(Adhesive Resin)

The adhesive resin used in the present invention is not particularly limited, and any resin can be appropriately selected from those used in the field of electronic parts, and the like. Examples of the adhesive resin include thermosetting resins and energy ray-curable resins.

Examples of the thermosetting resins include epoxy resins, melamine resins, urea resins, phenolic resins, silicone resins, urethane resins, polyimide resins, benzoxazine resins, thermosetting acrylic resins, and unsaturated polyester resins Among these, urethane resins and silicone resins are preferred from the viewpoint of having excellent heat resistance and having high adhesion.

When the above thermosetting resin is used, a curing agent, a curing accelerator, a curing retarder, a curing catalyst, and the like are preferably used in combination as aids.

Examples of the curing agent include compounds having in one molecule two or more functional groups capable of reacting with the functional groups of the thermosetting resin component. Examples of the curing agent for epoxy-based resins include phenolic curing agents, alcohol-based curing agents, amine-based curing agents, and aluminum chelate-based curing agents. In addition, examples of the curing agent for silicone-based resins include hydrosilyl-based curing agents.

Examples of the curing accelerator include tertiary amines such as triethylenediamine and benzyldimethylamine; imidazoles such as 2-methylimidazole and 2-phenylimidazole; organic phosphines such as tributylphosphine and diphenylphosphine; and tetraphenylboron salts such as tetraphenylphosphonium tetraphenylborate and triphenylphosphine tetraphenylborate.

Examples of the curing retarder include hydrosilylation reaction-controlling agents. Examples of the curing catalyst and the like include platinum-based catalysts, palladium-based catalysts, and rhodium-based catalysts.

The content of the above aid is different depending on the type of the thermosetting resin and is 10 to 90 parts by weight, preferably 20 to 80 parts by weight, and more preferably 30 to 70 parts by weight based on 100 parts by mass of the thermosetting resin.

Examples of the energy ray-curable resins can include compounds having one or two or more polymerizable unsaturated bonds such as compounds having an acrylate-based functional group. Examples of the compounds having one polymerizable unsaturated bond include ethyl(meth)acrylate, ethylhexyl(meth)acrylate, styrene, methylstyrene, and N-vinylpyrrolidone. In addition, examples of the compounds having two or more polymerizable unsaturated bonds can include polyfunctional compounds such as polymethylolpropane tri(meth)acrylate, hexanediol(meth)acrylate, tripropylene glycol di(meth)acrylate, diethylene glycol di(meth)acrylate, pentaerythritol tri(meth)acrylate, dipentaerythritol hexa(meth)acrylate, 1,6-hexanediol di(meth)acrylate, and neopentyl glycol di(meth)acrylate, modified products thereof, and reaction products of these polyfunctional compounds with (meth)acrylates and the like (for example, poly(meth)acrylate esters of polyhydric alcohols). A (meth)acrylate means a methacrylate and an acrylate herein.

In addition to the above compounds, polyester resins, polyether resins, acrylic resins, epoxy resins, urethane resins, silicone resins, polybutadiene resins, and the like having a polymerizable unsaturated bond and having a relatively low molecular weight can also be used as the above energy ray-curable resins.

A photopolymerization initiator is preferably used in combination with the above energy ray-curable resin. The photopolymerization initiator used in the present invention is contained in the adhesive resin composition comprising the above energy ray-curable resin, and allows the above energy ray-curable resin to cure under ultraviolet rays. As the photopolymerization initiator, for example, benzoin, benzoin methyl ether, benzoin ethyl ether, benzoin isopropyl ether, benzoin-n-butyl ether, benzoin isobutyl ether, acetophenone, dimethylaminoacetophenone, 1-hydroxy-cyclohexyl-phenyl ketone, 2,2-dimethoxy-2-phenylacetophenone, 2,2-diethoxy-2-phenylacetophenone, 2-hydroxy-2-methyl-1-phenylpropan-1-one, 2-aminoanthraquinone, 2-methylthioxanthone, 2-ethylthioxanthone, 2-chlorothioxanthone, 2,4-dimethylthioxanthone, 2,4-diethylthioxanthone, benzil dimethyl ketal, acetophenone dimethyl ketal, p-dimethylamine benzoate, and the like can be used.

One photopolymerization initiator may be used singly, or two or more photopolymerization initiators may be used in combination. In addition, the amount of the photopolymerization initiator blended is usually selected in the range of 0.2 to 10 parts by mass based on 100 parts by mass of the above energy ray-curable resin.

The mass average molecular weight of the adhesive resin used in the present invention is usually several hundreds to several millions.

The high thermally conductive portion is preferably formed of a resin composition comprising the above adhesive resin and a thermally conductive filler and/or an electrically conductive carbon compound in order to adjust to the desired thermal conductivity described later.

The thermally conductive filler and the electrically conductive carbon compound are sometimes referred to as "thermal conductivity adjustment substances" below.

(Thermally Conductive Filler and Electrically Conductive Carbon Compound)

The above thermally conductive filler is not particularly limited, but at least one selected from the group consisting of metal oxides such as silica, alumina, and magnesium oxide, metal nitrides such as silicon nitride, aluminum nitride, magnesium nitride, and boron nitride, and metals such as copper and aluminum is preferred. In addition, as the electrically conductive carbon compound, at least one selected from the group consisting of carbon black, carbon nanotubes (CNTs), graphene, carbon nanofibers, and the like is preferred. One of these thermally conductive fillers and electrically conductive carbon compounds can be used singly, or two or more of these thermally conductive fillers and electrically conductive carbon compounds can be used in combination. Among these, thermally conductive fillers such as metal oxides such as silica, alumina, and magnesium oxide and metal nitrides such as silicon nitride, aluminum nitride, magnesium nitride, and boron nitride are preferred in terms of being likely to be in the range of volume resistivity described later. In addition, a metal oxide and a metal nitride are more preferably contained as the thermally conductive fillers. Further, when a metal oxide and a metal nitride are contained as the thermally conductive fillers, the mass ratio of the metal oxide to the metal nitride is preferably 10:90 to 90:10, more preferably 20:80 to 80:20, and further preferably 50:50 to 75:25.

The shape of the thermal conductivity adjustment substance is not particularly limited, and may be any shape as long as the electrical properties and the like of an electronic device, element, or the like are not impaired by the contact of the thermal conductivity adjustment substance or mechanical damage when the thermally conductive adhesive sheet is affixed to the applied electronic device, element, or the like. The shape may be, for example, any of a plate shape (including a scaly shape), a spherical shape, a needle shape, a rod shape, and a fibrous shape.

For the size of the thermal conductivity adjustment substance, from the viewpoint of uniformly dispersing the thermal conductivity adjustment substance in the thickness direction of the high thermally conductive portion to improve thermal conductivity, for example, the average particle diameter is preferably 0.1 to 200 μm, more preferably 1 to 100 μm, further preferably 5 to 50 μm, and particularly preferably 10 to 30 μm. The average particle diameter can be measured, for example, by the Coulter counter method. When the average particle diameter of the thermal conductivity adjustment substance is in this range, the thermal conduction inside the individual substances does not decrease, and as a result, the thermal conductivity of the high thermally conductive portion improves. In addition, the flocculation of particles is less likely to occur, and the thermal conductivity adjustment substance can be uniformly dispersed. Further, the filling density in the high thermally conductive portion is sufficient, and the high thermally conductive portion is not brittle at the substance interface.

The content of the thermal conductivity adjustment substance is appropriately adjusted according to the desired thermal conductivity and is preferably 40 to 99% by mass, more preferably 50 to 95% by mass, and particularly preferably 50 to 80% by mass in the adhesive resin composition. When the content of the thermal conductivity adjustment substance is in this range, the heat dissipation properties, folding resistance, and bending resistance are excellent, and the strength of the high thermally conductive portion is maintained.

(Other Components)

For example, additives such as a cross-linking agent, a filling agent, a plasticizer, an antioxidant, an oxidation inhibitor, an ultraviolet absorbing agent, a colorant such as a pigment or a dye, a tackifier, an antistatic agent, and a coupling agent, and a non-adhesive resin may be contained in the adhesive resin composition in appropriate ranges as required.

Examples of the non-adhesive resin include polyester resins, urethane resins, silicone resins, rubber-based polymers, polyolefin resins, styrene resins, amide resins, cyclic olefin resins, vinyl chloride resins, polyimide resins, polycarbonate resins, and polysulfone resins.

<Low Thermally Conductive Portion>

The shape of the above low thermally conductive portion is not particularly limited and can be appropriately changed according to the specifications of an electronic device or the like described later, like the shape of the above high thermally conductive portion. Here, the low thermally conductive portion of the present invention refers to one having lower thermal conductivity than that of the above high thermally conductive portion.

The low thermally conductive portion is formed of an adhesive resin composition (referred to as an adhesive resin composition in the present invention even when it does not comprise the thermal conductivity adjustment substance and the like described above) and is not particularly limited as long as it is a material having lower thermal conductivity than that of the above high thermally conductive portion. When the thermal conductivity is sufficiently lower than the thermal conductivity of the above high thermally conductive portion, the thermal conductivity adjustment substance may be contained in the adhesive resin composition, but no thermal conductivity adjustment substance is more preferably contained in order to increase the difference from the thermal conductivity of the above high thermally conductive portion.

Examples of the adhesive resin include similar resins such as the thermosetting resin and the energy-curable resin used in the high thermally conductive portion described above. Usually, the same resin as that for the high thermally conductive portion is used from the viewpoint of mechanical properties, adherence properties, and the like.

(Other Components)

The same types of additives may be further contained in the low thermally conductive portion in appropriate ranges as required, like the above high thermally conductive portion.

The thicknesses of the respective layers of the high thermally conductive portion and the low thermally conductive portion are preferably 1 to 200 μm, further preferably 3 to 100 μm. When the thicknesses are in this range, heat can be selectively dissipated in a particular direction. In addition, the thicknesses of the respective layers of the high thermally conductive portion and the low thermally conductive portion may be the same or different.

The widths of the respective layers of the high thermally conductive portion and the low thermally conductive portion are appropriately adjusted and used depending on the specifications of an applied electronic device and are usually 0.01 to 3 mm, preferably 0.1 to 2 mm, and further preferably 0.5 to 1.5 mm. When the widths are in this range, heat can be selectively dissipated in a particular direction. In addition, the widths of the respective layers of the high thermally conductive portion and the low thermally conductive portion may be the same or different.

The thermal conductivity of the high thermally conductive portion should be sufficiently higher than that of the low thermally conductive portion, and the thermal conductivity is preferably 0.5 (W/m·K) or more, more preferably 1.0 (W/m·K) or more, and further preferably 1.3 (W/m·K) or more. The upper limit of the thermal conductivity of the high thermally conductive portion is not particularly limited but is usually preferably 2000 (W/m·K) or less, more preferably 500 (W/m·K) or less.

The thermal conductivity of the low thermally conductive portion is preferably less than 0.5 (W/m·K), more preferably 0.3 (W/m·K) or less, and further preferably 0.25 (W/m·K) or less. When the conductivities of the high thermally conductive portion and the low thermally conductive portion are in the ranges as described above, heat can be selectively dissipated in a particular direction.

The storage modulus of the high thermally conductive portion at 150° C. after curing is preferably 0.1 MPa or more, more preferably 0.15 MPa or more, and further preferably 1 MPa or more. In addition, the storage modulus of the low thermally conductive portion at 150° C. after curing is preferably 0.1 MPa or more, more preferably 0.15 MPa or more, and further preferably 1 MPa or more. When the storage moduli of the high thermally conductive portion and the low thermally conductive portion at 150° C. after curing are 0.1 MPa or more, excessive deformation of the thermally conductive adhesive sheet is suppressed, and heat can be stably dissipated. The upper limit of the storage modulus at 150° C. is not particularly limited but is preferably 500 MPa or less, more preferably 100 MPa or less, and further preferably 50 MPa or less. By adjusting the selection and combination of the adhesive resin and the types and amounts of the thermally conductive filler and the electrically conductive carbon compound in the above-described resin composition, the storage moduli of the high thermally conductive portion and the low thermally conductive portion at 150° C. after curing can be adjusted.

The storage modulus at 150° C. is a value obtained by increasing the temperature to 150° C. at a temperature increase rate of 3° C./min with an initial temperature of 15° C. and measuring at a frequency of 11 Hz by a dynamic modulus measuring apparatus [manufactured by TA Instruments, model name "DMA Q800"].

In addition, the thermally conductive adhesive sheet is affixed to an electronic device without an adhesive layer therebetween and therefore preferably has the function of preventing electrical connection. Therefore, the volume resistivities of the high thermally conductive portion and the low thermally conductive portion are preferably $1 \times 10^{10}$ Ω·cm or more, more preferably $1.0 \times 10^{13}$ Ω·cm or more.

The volume resistivity is a value measured by a resistivity meter (manufactured by Mitsubishi Chemical Analytech Co., Ltd., MCP-HT450) after the thermally conductive adhesive sheet is allowed to stand in an environment of 23° C. and 50% RH for one day.

For example, when the high thermally conductive portions and the low thermally conductive portions each independently constitute the entire thickness of the thermally conductive adhesive sheet in the thermally conductive adhesive sheet as in FIG. 1 and FIG. 2(a), the height difference between the high thermally conductive portions and the low thermally conductive portions is preferably 10 μm or less, more preferably 5 μm or less, and further preferably substantially absent on the outer face of the thermally conductive adhesive sheet.

In the cases in which at least either the high thermally conductive portions or the low thermally conductive portions constitute a portion of the thickness of the base material, for example, in the cases of FIGS. 2(b) and 2(c), the height difference between the high thermally conductive portion(s) and the low thermally conductive portion(s) is preferably 10 μm or less, more preferably 5 μm or less, and further preferably substantially absent. Further, in the cases of FIGS. 2(d) and 2(e) in which a predetermined height difference is provided between the high thermally conductive portion(s) and the low thermally conductive portion(s), the height difference between the high thermally conductive portion(s) and the low thermally conductive portion(s) when the thickness of the base material is defined as a thickness comprising the thicknesses of the high thermally conductive portion(s) and the low thermally conductive portion(s) is preferably 10 to 90% with respect to the thickness of the base material. In addition, in the thermally conductive adhesive sheet, the volume ratio of the high thermally conductive portion(s) to the low thermally conductive portion(s) is preferably 10:90 to 90:10, more preferably 20:80 to 80:20, and further preferably 30:70 to 70:30.

<Release Sheet>

The thermally conductive adhesive sheet may have a release sheet on one side or both sides. Examples of the release sheet include sheets obtained by applying release agents such as silicone resins and fluororesins to paper such as glassine paper, coated paper, and laminated paper and various plastic films. The thickness of the release sheet is not particularly limited but is usually 10 to 200 μm. As the supporting base material used in the release sheet used in the present invention, plastic films are preferably used.

<Electronic Device>

The electronic device using the thermally conductive adhesive sheet of the present invention is not particularly limited. From the viewpoint of heat control such as heat dissipation, examples of the electronic device include thermoelectric conversion devices, photoelectric conversion devices, and semiconductor devices such as large scale integrated circuits. Particularly, by affixing the thermally conductive adhesive sheet to the thermoelectric conversion module of a thermoelectric conversion device, heat can be selectively dissipated in a particular direction, leading to a further improvement in thermoelectric performance. Therefore, the thermally conductive adhesive sheet is preferably used in thermoelectric conversion devices.

The thermally conductive adhesive sheet may be laminated on one face of the electronic device or on both faces. This is appropriately selected in accordance with the specifications of the electronic device.

The electronic device will be described below by taking the case of a thermoelectric conversion device as an example.

(Thermoelectric Conversion Device)

A thermoelectric conversion device is an electronic device in which power is easily obtained by providing a temperature difference to the inside of thermoelectric conversion elements that perform mutual energy conversion between heat and electricity.

Figure 3:
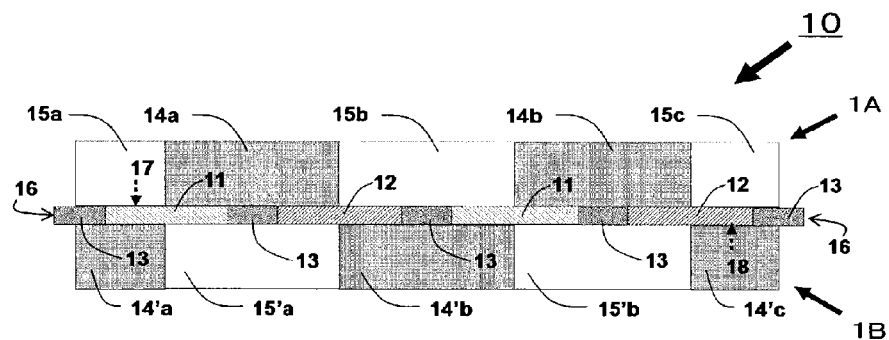
FIG. 3 is a cross-sectional view showing one example of a thermoelectric conversion device when the thermally conductive adhesive sheets of the present invention are affixed to a thermoelectric conversion module.

FIG. 3 is a cross-sectional view showing one example of a thermoelectric conversion device in which the thermally conductive adhesive sheets of the present invention having the configuration in FIG. 2(a) are affixed to a thermoelectric conversion module. A thermoelectric conversion device 10 shown in FIG. 3 is composed of a thermoelectric conversion module 16 which has on a support (not shown) thermoelectric conversion elements composed of thin film P-type thermoelectric elements 11 comprising a P-type material and thin film N-type thermoelectric elements 12 comprising an N-type material and further is provided with electrodes 13, a thermally conductive adhesive sheet 1A affixed to the first face 17 of the thermoelectric conversion module 16, and further a thermally conductive adhesive sheet 1B affixed to a second face 18 opposite to the above first face 17.

The thermally conductive adhesive sheet 1A has high thermally conductive portions 14a and 14b and low thermally conductive portions 15a, 15b, and 15c. The high thermally conductive portions 14a and 14b and the low thermally conductive portions 15a, 15b, and 15c have adhesiveness, and they constitute the outer face of the thermally conductive adhesive sheet. In addition, the thermally conductive adhesive sheet 1B has high thermally conductive portions 14'a, 14'b, and 14'c and low thermally conductive portions 15'a and 15'b. The high thermally conductive portions 14'a, 14'b, and 14'c and the low thermally conductive portions 15'a and 15'b have adhesiveness, and they constitute the outer face of the thermally conductive adhesive sheet.

Figure 4:
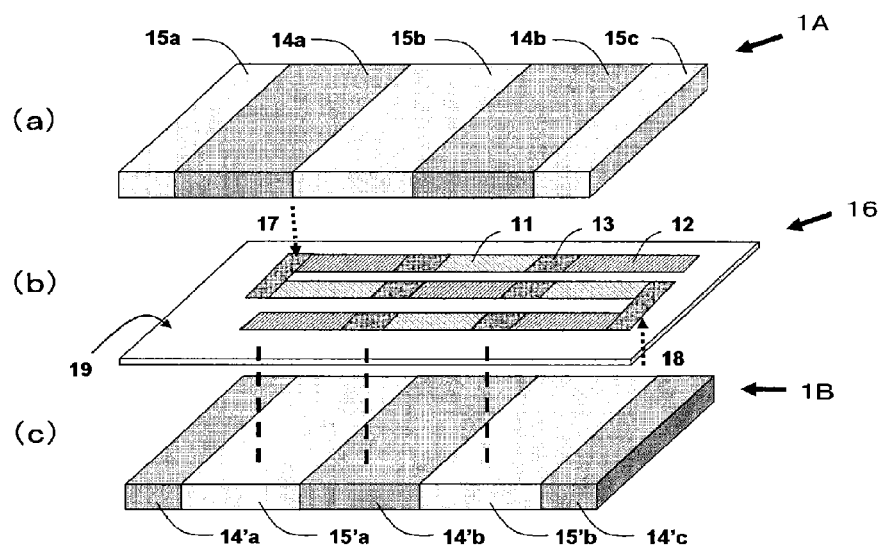
FIG. 4 shows one example of a perspective view in which the thermally conductive adhesive sheets of the present invention and a thermoelectric conversion module are disassembled for each component, and (a) is a perspective view of the thermally conductive adhesive sheet directly provided on thermoelectric elements on the front face side of the support of the thermoelectric conversion module, (b) is a perspective view of the thermoelectric conversion module, and (c) is a perspective view of the thermally conductive adhesive sheet provided on the back face side of the support of the thermoelectric conversion module.

FIG. 4 shows one example of a perspective view in which the thermally conductive adhesive sheets of the present invention and a thermoelectric conversion module are disassembled for each component. In FIG. 4, (a) is a perspective view of the thermally conductive adhesive sheet 1A directly provided on the thermoelectric elements 11 and 12 on the front face side of the support 19 of the thermoelectric conversion module 16, (b) is a perspective view of the thermoelectric conversion module 16, and (c) is a perspective view of the thermally conductive adhesive sheet 1B provided on the back face side of the support 19 of the thermoelectric conversion module 16.

By the configuration as described above, heat can be efficiently diffused from the thermally conductive adhesive sheet 1A and the thermally conductive adhesive sheet 1B. In addition, by lamination in which the positions are displaced so that the high thermally conductive portions 14a and 14b of the thermally conductive adhesive sheet 1A are not opposed to the high thermally conductive portions 14'a, 14'b, and 14'c of the thermally conductive adhesive sheet 1B, heat can be selectively dissipated in a particular direction. Thus, a temperature difference can be efficiently provided to the thermoelectric conversion module, and a thermoelectric conversion device having high power generation efficiency is obtained.

The thermoelectric conversion module 16 used in the present invention is composed of the P-type thermoelectric elements 11, the N-type thermoelectric elements 12, and the electrodes 13, for example, as shown in FIG. 4(b). The P-type thermoelectric elements 11 and the N-type thermoelectric elements 12 are formed into a thin film shape in series connection, and they are joined and electrically connected at respective ends via the electrodes 13. The P-type thermoelectric elements 11 and the N-type thermoelectric elements 12 in the thermoelectric conversion module 16 may be arranged in order of "the electrode 13, the P-type thermoelectric element 11, the electrode 13, the N-type thermoelectric element 12, the electrode 13," as shown in FIG. 3, in order of "the electrode 13, the P-type thermoelectric element 11, the N-type thermoelectric element 12, the electrode 13, the P-type thermoelectric element 11, the N-type thermoelectric element 12, the electrode 13, . . . ," or further in order of "the electrode 13, the P-type thermoelectric element 11, the N-type thermoelectric element 12, the P-type thermoelectric element 11, the N-type thermoelectric element 12, . . . the electrode 13."

In addition, the thermoelectric conversion module may be directly formed on the high thermally conductive portions and the low thermally conductive portions or may be formed via another layer, but in terms of being able to efficiently provide a temperature difference to the thermoelectric elements, the thermoelectric conversion module is preferably directly formed on the high thermally conductive portions and the low thermally conductive portions.

For the above thermoelectric elements, materials having a large absolute value of the Seebeck coefficient, low thermal conductivity, and high electrical conductivity, that is, so-called high thermoelectric figure of merit, in the temperature range of a source of heat converted to electrical energy by the thermoelectric conversion module are preferably used, though not particularly limited.

The materials constituting the P-type thermoelectric elements and the N-type thermoelectric elements are not particularly limited as long as they have thermoelectric conversion properties. Bismuth-tellurium-based thermoelectric semiconductor materials such as bismuth telluride and $Bi_2Te_3$, telluride-based thermoelectric semiconductor materials such as GeTe and PbTe, antimony-tellurium-based thermoelectric semiconductor material, zinc-antimony-based thermoelectric semiconductor materials such as ZnSb, $Zn_3Sb_2$, and $Zn_4Sb_3$, silicon-germanium-based thermoelectric semiconductor materials such as SiGe, bismuth selenide-based thermoelectric semiconductor materials such as $Bi_2Se_3$, silicide-based thermoelectric semiconductor materials such as $\beta$-$FeSi_2$, $CrSi_2$, $MnSi_{1.73}$, and $Mg_2Si$, oxide-based thermoelectric semiconductor materials, Heusler materials such as FeVAl, FeVAlSi, and FeVTiAl, and the like are used.

The thicknesses of the P-type thermoelectric elements 11 and the N-type thermoelectric elements 12 are preferably 0.1 to 100 μm, further preferably 1 to 50 μm.

The thicknesses of the P-type thermoelectric elements 11 and the N-type thermoelectric elements 12 are not particularly limited and may be the same or different.

[Method for Producing Thermally Conductive Adhesive Sheet]

A method for producing a thermally conductive adhesive sheet according to the present invention is a method for producing a thermally conductive adhesive sheet which is composed of a high thermally conductive portion and a low thermally conductive portion and in which the high thermally conductive portion and the low thermally conductive portion each independently constitute the entire thickness of the thermally conductive adhesive sheet, or either the high thermally conductive portion or the low thermally conductive portion constitutes a portion of the thickness of the thermally conductive adhesive sheet, the method comprising the step of forming on a release sheet a high thermally conductive portion formed of an adhesive resin composition and a low thermally conductive portion formed of an adhesive resin composition.

<High Thermally Conductive Portion Forming Step>

This step is the step of forming a high thermally conductive portion. The high thermally conductive portion is formed on a release sheet, or on a release sheet and on a low thermally conductive portion, using the above adhesive resin composition comprising an adhesive resin and a thermally conductive filler and/or an electrically conductive carbon compound. The method for applying the adhesive resin composition is not particularly limited, and, for example, the high thermally conductive portion should be formed by a known method such as a stencil printing method, a dispenser, a screen printing method, a roll coating method, or a slot die.

The curing conditions when a thermosetting adhesive resin is used in the adhesive resin composition used in the present invention are appropriately adjusted depending on the composition used, but it is preferably 80° C. to 150° C., and more preferably 90° C. to 120° C. In addition, the curing can also be performed while pressure is applied as required.

In addition, when an energy ray-curable adhesive resin is used, examples of the energy radiation include electron beams, X rays, radiation, and visible light in addition to ultraviolet rays. Among these, ultraviolet rays are preferably used, and as the light source, for example, low pressure mercury lamps, medium pressure mercury lamps, high pressure mercury lamps, ultrahigh pressure mercury lamps, carbon arc lamps, metal halide lamps, and xenon lamps can be used. The amount of light is usually 100 to 1500 mJ/cm$^2$. In addition, when electron beams are used, an electron beam accelerator or the like is used, and the amount of irradiation is usually 150 to 350 kV. When ultraviolet rays are used, it is necessary to add the above-described photopolymerization initiator to the adhesive resin composition. In addition, when electron beams are used, a cured film can be obtained without adding a photopolymerization initiator.

<Low Thermally Conductive Portion Forming Step>

This step is the step of forming a low thermally conductive portion. The low thermally conductive portion is formed on a release sheet, or on a release sheet and on the high thermally conductive portion, using the above adhesive resin composition comprising an adhesive resin. The method for applying the adhesive resin composition is not particularly limited, and, for example, the low thermally conductive portion should be formed by a known method such as a stencil printing method, a dispenser, a screen printing method, a roll coating method, or a slot die, like the high thermally conductive portion. In addition, the curing method is also similar to the method for curing the high thermally conductive portion.

The order of the formation of the high thermally conductive portion and the low thermally conductive portion is not particularly limited. It may be appropriately selected depending on the specifications of an electronic device.

According to the producing method of the present invention, a thermally conductive adhesive sheet that can release heat, or control the flow of heat in a particular direction, inside an electronic device or the like and has low cost can be produced by a simple method.

EXAMPLES

Next, the present invention will be described in more detail by Examples, but the present invention is not limited in any way by these examples.

The thermal conductivity measurement and temperature difference evaluation of thermally conductive sheets fabricated in Examples and Comparative Examples and the evaluation of electronic devices were performed by the following methods.

(a) Thermal Conductivity Measurement of Thermally Conductive Adhesive Sheet

The thermal conductivity was measured using a thermal conductivity measuring apparatus (manufactured by EKO, HC-110).

Figure 5:
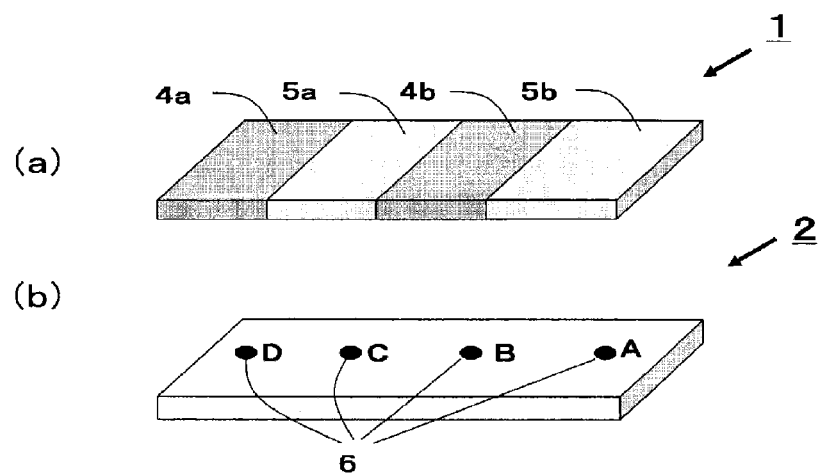
FIG. 5 shows explanatory diagrams of a configuration for measuring the temperature difference between the high thermally conductive portions and low thermally conductive portions of the thermally conductive adhesive sheet of the present invention, and (a) shows the thermally conductive adhesive sheet, and (b) is a perspective view of a glass substrate used as an adherend.

(b) Temperature Measurement of High Thermally Conductive Portions and Low Thermally Conductive Portions The obtained thermally conductive adhesive sheet was affixed to the upper face of an adherend 2 comprising soda glass (size 50 mm×50 mm, thickness 0.5 mm) as shown in FIG. 5, and then the release sheet was peeled. Then, the lower face of the adherend 2 was heated at 75° C. for 1 hour to stabilize the temperature, and then the temperature of the adherend was measured by K thermocouples (Chromel-Alumel) attached to the upper face of the adherend 2. The thermocouples were provided on the adherend in portions corresponding to the high thermally conductive portions and the low thermally conductive portions (measurement places: A, B, C, and D in FIG. 5). The temperatures of the thermocouples were measured every second for 5 minutes, and the average value of the obtained temperatures at each point was calculated.

(Fabrication of Thermoelectric Conversion Module)

Figure 6:
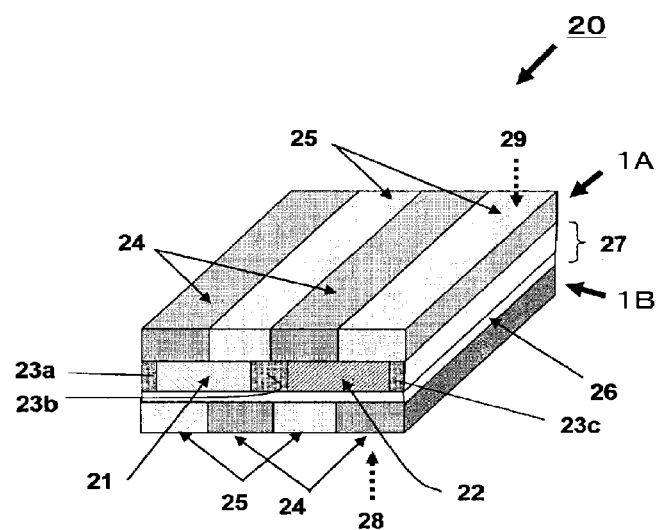
FIG. 6 is a perspective view of a thermoelectric conversion module used in Examples of the present invention.
Figure 7:
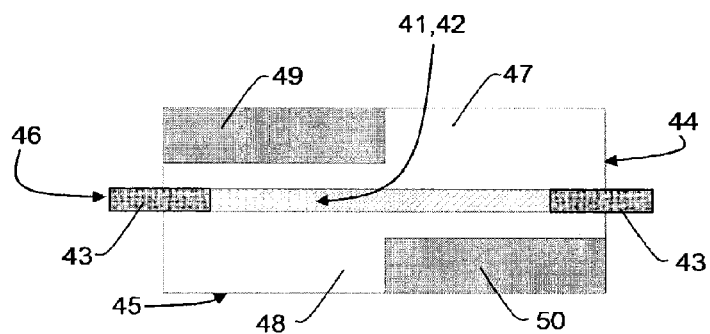
FIG. 7 is a cross-sectional view showing one example of the configuration of a conventional thermoelectric conversion device.
Figure 8:
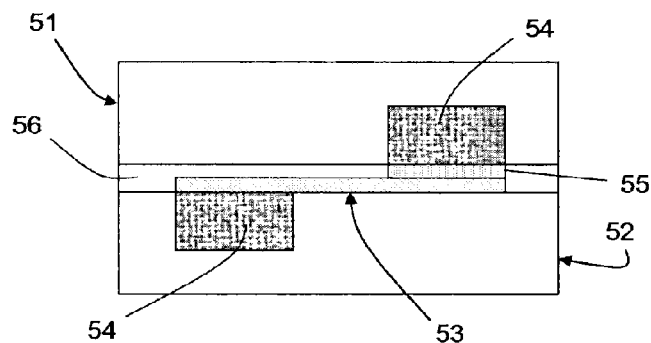
FIG. 8 is a cross-sectional view showing another example of the configuration of a conventional thermoelectric conversion device.
Figure 9:
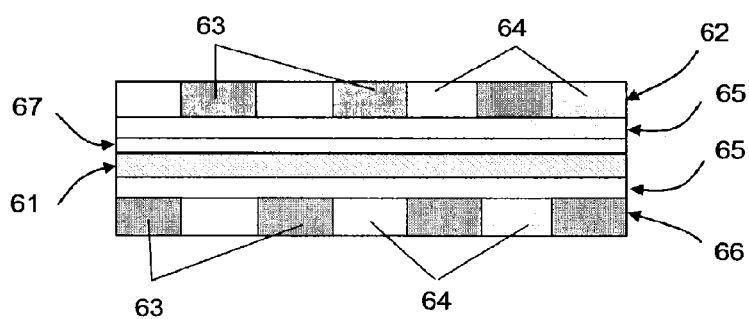
FIG. 9 is a cross-sectional view showing still another example of the configuration of a conventional thermoelectric conversion device.

As shown in part of FIG. 6, a P-type thermoelectric element 21 (P-type bismuth-tellurium-based thermoelectric semiconductor material) and an N-type thermoelectric element 22 (N-type bismuth-tellurium-based thermoelectric semiconductor material) were arranged on a support 26 so as to each have the same size (width 1.7 mm×length 100 mm, thickness 0.5 mm), and copper electrodes (copper electrode 23a: width 0.15 mm×length 100 mm, thickness 0.5 mm; copper electrode 23b: width 0.3 mm×length 100 mm, thickness 0.5 mm; and copper electrode 23c: width 0.15 mm×length 100 mm, thickness 0.5 mm) were provided on both thermoelectric elements and between the thermoelectric elements to fabricate a thermoelectric conversion module 27.

(Electronic Device Evaluation)

In a state in which the lower face 28 of each of thermoelectric conversion devices obtained in Examples and Comparative Examples (see FIG. 6) was heated to 75° C. on a hot plate, and the upper face 29 on the opposite side (see FIG. 6) was cooled to 25° C., the thermoelectric conversion device was held as it was for 1 hour to stabilize the temperature, and then the thermoelectromotive force V (V) and the electrical resistance R (Ω) were measured. The output P (IV) was calculated by P=V$^2$/R using the measured thermoelectromotive force V and electrical resistance R.

Example 1

(1) Fabrication of Thermally Conductive Adhesive Sheet

31 Parts by mass of a polyol resin-containing solution (manufactured by ASIA INDUSTRY CO., LTD., "PX41-1"), 9 parts by mass of a polyisocyanate resin-containing solution (manufactured by ASIA INDUSTRY CO., LTD., "Excel Hardener G"), and 40 parts by mass of boron nitride (manufactured by Showa Denko K. K., "ALUNABEADS CB-A20S," average particle diameter 20 μm) and 20 parts by mass of alumina (manufactured by Showa Denko K. K., "SHOBN UHP-2," average particle diameter 12 μm) as thermally conductive fillers were added, and mixed and dispersed using a rotation-revolution mixer (manufactured by THINKY, "ARE-250") to prepare an adhesive resin composition for the formation of high thermally conductive portions.

On the other hand, 78% by mass of a polyol resin-containing solution (manufactured by ASIA INDUSTRY CO., LTD., "PX41-1") and 22% by mass of a polyisocyanate resin-containing solution (manufactured by ASIA INDUSTRY CO., LTD., "Excel Hardener G") were mixed and dispersed to prepare an adhesive resin composition for the formation of low thermally conductive portions.

Next, the above adhesive resin composition for the formation of high thermally conductive portions was applied to the release-treated face of a release sheet (manufactured by LINTEC Corporation, "SP-PET382150") using a dispenser (manufactured by Musashi engineering, "ML-808FXcom-CE") and dried at 90° C. for 1 minute to remove the solvents to form high thermally conductive portions comprising stripe-shaped patterns (width 1 mm×length 100 mm, thickness 50 center distance between patterns 2 mm). Further, the adhesive resin composition for the formation of low thermally conductive portions was applied thereon using an applicator and dried at 90° C. for 1 minute to form low thermally conductive portions having the same thickness as that of the high thermally conductive portions between the stripe-shaped patterns of the high thermally conductive portions to obtain a thermally conductive adhesive sheet. It was confirmed that the low thermally conductive portions were not formed on the high thermally conductive portions.

(2) Fabrication of Thermoelectric Conversion Device

Two of the obtained thermally conductive adhesive sheets were provided, and the thermally conductive adhesive sheets were laminated on the face of the thermoelectric conversion module 27 on the side on which the thermoelectric elements were formed and on the face on the support side, respectively, as shown in FIG. 6. Then, the release sheets were peeled and removed, and the laminate was heated at 120° C. for 20 minutes to cure the thermally conductive adhesive sheets to fabricate a thermoelectric conversion device on both faces of which the thermally conductive adhesive sheets were laminated.

The storage modulus of the high thermally conductive portions at 150° C. after curing was 4.2 MPa, and the storage modulus of the low thermally conductive portions at 150° C. after curing was 0.2 MPa. In addition, the volume resistivity of the high thermally conductive portions was $7.0 \times 10^{14}$ Ω·cm, and the volume resistivity of the low thermally conductive portions was $2.0 \times 10^{15}$ Ω·cm.

Example 2

(1) Fabrication of Thermally Conductive Adhesive Sheet

An acrylate copolymer (butyl acrylate/methyl methacrylate/2-hydroxyethyl acrylate=62/10/28) and methacryloyloxyethyl isocyanate were mixed so that the amount of the methacryloyloxyethyl isocyanate was 80.5 equivalents based on 100 equivalents of the 2-hydroxyethyl acrylate of the acrylate copolymer. Dibutyltin dilaurate was added as a catalyst, and the mixture was polymerized in an organic solvent under a nitrogen atmosphere at room temperature for 24 hours to obtain a solution of an acrylate copolymer having an energy ray-curable group in a side chain (solids 40% by mass).

100 Parts by mass of the obtained solution of the acrylate copolymer having an energy ray-curable group in a side chain, 3.7 parts by mass of 1-hydroxy-cyclohexyl-phenyl ketone (manufactured by Ciba Specialty Chemicals, trade name: IRGACURE 184), a photopolymerization initiator, and 40 parts by weight of boron nitride (manufactured by Showa Denko K. K., "ALUNABEADS CB-A20S," average particle diameter 20 μm) and 20 parts by weight of alumina (manufactured by Showa Denko K. K., "SHOBN UHP-2," average particle diameter 12 μm) as thermally conductive fillers were added, and mixed and dispersed using a rotation-revolution mixer (manufactured by THINKY, "ARE-250") to prepare an adhesive resin composition for the formation of high thermally conductive portions.

On the other hand, 100 parts by mass of the obtained solution of the acrylate copolymer (solids 40% by mass) and 3.7 parts by mass of 1-hydroxy-cyclohexyl-phenyl ketone (manufactured by Ciba Specialty Chemicals, trade name: IRGACURE 184), a photopolymerization initiator, were mixed and dispersed to prepare an adhesive resin composition for the formation of low thermally conductive portions.

Then, a thermally conductive adhesive sheet was fabricated as in Example 1 using the obtained adhesive resin composition for the formation of high thermally conductive portions and adhesive resin composition for the formation of low thermally conductive portions.

(2) Fabrication of Thermoelectric Conversion Device

Two of the obtained thermally conductive adhesive sheets were provided, and the thermally conductive adhesive sheets were laminated on the face of the thermoelectric conversion module 27 on the side on which the thermoelectric elements were formed and on the face on the support side, respectively. Then, the release sheets were peeled and removed, and both faces were irradiated with ultraviolet rays to cure the thermally conductive adhesive sheets to fabricate a thermoelectric conversion device on both faces of which the thermally conductive adhesive sheets were laminated.

The storage modulus of the high thermally conductive portions at 150° C. after curing was 0.1 MPa, and the storage modulus of the low thermally conductive portions at 150° C. after curing was 0.02 MPa. The volume resistivity of the high thermally conductive portions was $8.0 \times 10^{14}$ Ω·cm, and the volume resistivity of the low thermally conductive portions was $1.5 \times 10^{15}$ Ω·cm.

Example 3

(1) Fabrication of Thermally Conductive Adhesive Sheet 19.8 Parts by mass of a silicone resin A (manufactured by Wacker Asahikasei Silicone Co., Ltd., "SilGel612-A"), 19.8 parts by mass of a silicone resin B (manufactured by Wacker Asahikasei Silicone Co., Ltd., "SilGel612-B"), 0.4 parts by mass of a curing retarder (manufactured by Wacker Asahikasei Silicone Co., Ltd., "PT88"), and 40 parts by mass of boron nitride (manufactured by Showa Denko K. K., "ALUNABEADS CB-A20S," average particle diameter 20 μm) and 20 parts by mass of alumina (manufactured by Showa Denko K. K., "SHOBN UHP-2," average particle diameter 12 μm) as thermally conductive fillers were added, and mixed and dispersed using a rotation-revolution mixer (manufactured by THINKY, "ARE-250") to prepare an adhesive resin composition for the formation of high thermally conductive portions.

On the other hand, 90 parts by mass of a silicone resin C (manufactured by Shin-Etsu Chemical Co., Ltd., "KE-106"), 9 parts by mass of a platinum-based catalyst (manufactured by Shin-Etsu Chemical Co., Ltd., "CAT-RG"), a curing catalyst, and 1 part by mass of a curing retarder (manufactured by Shin-Etsu Chemical Co., Ltd., "No. 6-10") were mixed and dispersed to prepare an adhesive resin composition for the formation of low thermally conductive portions.

Then, a thermally conductive adhesive sheet was fabricated as in Example 1 using the obtained adhesive resin composition for the formation of high thermally conductive portions and adhesive resin composition for the formation of low thermally conductive portions except that the release sheet was changed to "PET50FD" manufactured by LINTEC Corporation, and drying at 90° C. for 1 minute was changed to drying at 150° C. for 5 minutes.

(2) Fabrication of Thermoelectric Conversion Device

A thermoelectric conversion device on both faces of which thermally conductive adhesive sheets were laminated was fabricated as in Example 1 except that the thermally conductive adhesive sheets were cured by heating not at 120° C. for 20 minutes but at 150° C. for 30 minutes.

The storage modulus of the high thermally conductive portions at 150° C. after curing was 2.3 MPa, and the storage modulus of the low thermally conductive portions at 150° C. after curing was 3.4 MPa. The volume resistivity of the high thermally conductive portions was $6.0 \times 10^{14}$ Ω·cm, and the volume resistivity of the low thermally conductive portions was $2.2 \times 10^{15}$ Ω·cm.

Example 4

(1) Fabrication of Thermally Conductive Adhesive Sheet 19.9 Parts by mass of a silicone resin D (manufactured by Dow Corning Toray Co., Ltd., "SD4584"), 0.2 parts by mass of a platinum-based catalyst (manufactured by Dow Corning Toray Co., Ltd., "SRX212") as a curing catalyst, 19.8 parts by mass of an epoxy-modified silicone oil of an epoxy resin (manufactured by Shin-Etsu Chemical Co., Ltd., "X-22-163C"), 0.2 parts by mass of a 10% toluene solution of aluminum trisacetylacetonate, an aluminum-based chelate compound, as a curing agent, and 40 parts by mass of boron nitride (manufactured by Showa Denko K. K., "ALUNABEADS CB-A20S," average particle diameter 20 μm) and 20 parts by mass of alumina (manufactured by Showa Denko K. K., "SHOBN UHP-2," average particle diameter 12 μm) as thermally conductive fillers were added, and mixed and dispersed using a rotation-revolution mixer (manufactured by THINKY, "ARE-250") to prepare an adhesive resin composition for the formation of high thermally conductive portions.

On the other hand, 19.8 parts by mass of the silicone resin D (Dow Corning Toray Co., Ltd. "SD4584"), 0.2 parts by mass of a platinum-based catalyst (Dow Corning Toray Co., Ltd. "SRX212") as a curing catalyst, 19.8 parts by mass of an epoxy-modified silicone oil of an epoxy resin (Shin-Etsu Chemical Co., Ltd. "X-22-163C"), and 0.2 parts by mass of a 10% toluene solution of aluminum trisacetylacetonate, an aluminum-based chelate compound, as a curing agent were mixed and dispersed to prepare an adhesive resin composition for the formation of low thermally conductive portions.

Then, a thermally conductive adhesive sheet was fabricated as in Example 1 using the obtained filler-containing adhesive resin composition for the formation of high thermally conductive portions and adhesive resin composition for the formation of low thermally conductive portions except that the release sheet was changed to "PET50FD" manufactured by LINTEC Corporation, and drying at 130° C. for 2 minutes was performed.

(2) Fabrication of Thermoelectric Conversion Device

A thermoelectric conversion device on both faces of which thermally conductive adhesive sheets were laminated was fabricated as in Example 1 except that the thermally conductive adhesive sheets were cured by heating not at 120° C. for 20 minutes but at 150° C. for 30 minutes.

The storage modulus of the high thermally conductive portions at 150° C. after curing was 21 MPa, and the storage modulus of the low thermally conductive portions at 150° C. after curing was 1.7 MPa. The volume resistivity of the high thermally conductive portions was $6.4 \times 10^{14}$ Ω·cm, and the volume resistivity of the low thermally conductive portions was $8.9 \times 10^{14}$ Ω·cm.

Example 5

High thermally conductive portions comprising stripe-shaped patterns (width 1 mm×length 100 mm, thickness 50 center distance between patterns 2 mm) were formed on the release-treated face of a release sheet as in Example 1 using the adhesive resin composition for the formation of high thermally conductive portions used in Example 1.

Then, the adhesive resin composition for the formation of low thermally conductive portions used in Example 1 was applied thereon and dried at 90° C. for 1 minute to form a low thermally conductive portion having a thickness of 75 μm to fabricate a thermally conductive adhesive sheet. The thermally conductive adhesive sheet had a configuration in which the low thermally conductive portion was formed between the stripe-shaped patterns of the high thermally conductive portions and on the high thermally conductive portions, and a low thermally conductive portion having a thickness of 25 μm was formed on the high thermally conductive layer portions. Two of the obtained thermally conductive adhesive sheets were provided, and as in Example 1, the thermally conductive adhesive sheets were laminated on the face of the thermoelectric conversion module 27 on the side on which the thermoelectric elements were formed and on the face on the support side by affixing, to the respective faces, the faces on the sides composed of only the low thermally conductive portions like the lower face side in FIG. 2(c). Then, the release sheets were peeled and removed, and the laminate was heated at 120° C. for 20 minutes to cure the thermally conductive adhesive sheets to fabricate a thermoelectric conversion device on both faces of which the thermally conductive adhesive sheets were laminated.

The storage modulus of the high thermally conductive portions at 150° C. after curing was 4.2 MPa, and the storage modulus of the low thermally conductive portions at 150° C. after curing was 0.2 MPa.

Example 6

Two of the thermally conductive adhesive sheets obtained in Example 5 were provided, and the thermally conductive adhesive sheets were laminated on the face of the thermoelectric conversion module 27 on the side on which the thermoelectric elements were formed and on the face on the support side by affixing, to the respective faces, the faces on the sides composed of the high thermally conductive portions and the low thermally conductive portions like the upper face side in FIG. 2(c). Then, the release sheets were peeled and removed, and the laminate was heated at 120° C. for 20 minutes to cure the thermally conductive adhesive sheets to fabricate a thermoelectric conversion device on both faces of which the thermally conductive adhesive sheets were laminated.

The storage modulus of the high thermally conductive portions at 150° C. after curing was 4.2 MPa, and the storage modulus of the low thermally conductive portions at 150° C. after curing was 0.2 MPa.

Comparative Example 1

A silicone-based adhesive was applied on a PGS graphite sheet (manufactured by Panasonic Devices, thermal conductivity: 1950 (W/m·K), thickness: 100 μm) and dried at 90° C. for 1 minute to form an adhesive layer having a thickness of 10 μm to fabricate a thermally conductive adhesive sheet.

Two of the obtained thermally conductive adhesive sheets were provided, and the thermally conductive adhesive sheets were laminated on the face of the thermoelectric conversion module 27 on the side on which the thermoelectric elements were formed and on the face on the support side, respectively, to fabricate a thermoelectric conversion device on both faces of which the thermally conductive adhesive sheets were laminated.

Comparative Example 2

The measurement of the temperature difference was performed without affixing a thermally conductive adhesive sheet to an adherend. In addition, electronic device evaluation was performed without laminating thermally conductive adhesive sheets on the thermoelectric conversion module 27.

The evaluation results of the thermoelectric conversion devices obtained in Examples 1 to 6 and Comparative Examples 1 and 2 are shown in Table 1.

TABLE 1

| | Configuration of thermally conductive adhesive sheet | Thermal conductivity (W/m · K) | | | | Temperature difference evaluation temperature (° C.) | | | | Electronic device evaluation output (mW) |
| | | High thermally conductive portions | Filler-containing adhesive resin composition | Low thermally conductive portion(s) | Adhesive resin composition | A | B | C | D | |
|---|---|---|---|---|---|---|---|---|---|---|
| Example 1 | FIG. 2(a) | 1.8 | Urethane resin + thermally conductive fillers (boron nitride and alumina) | 0.2 | Urethane resin | 25 | 65 | 25 | 65 | 19.8 |
| Example 2 | FIG. 2(a) | 1.9 | Energy-curable resin + thermally conductive fillers (boron nitride and alumina) | 0.2 | Energy-curable resin | 25 | 65 | 25 | 65 | 19.9 |
| Example 3 | FIG. 2(a) | 1.9 | Silicone resin A + silicone resin B + thermally conductive fillers (boron nitride and alumina) | 0.15 | Silicone resin C | 25 | 65 | 24 | 65 | 20.0 |
| Example 4 | FIG. 2(a) | 1.8 | Silicone resin D + epoxy resin + thermally conductive fillers (boron nitride and alumina) | 0.15 | Silicone resin D + epoxy resin | 24 | 65 | 24 | 65 | 19.8 |
| Example 5 | FIG. 2(c) lower face is affixed | 1.8 | Urethane resin + thermally conductive fillers (boron nitride and alumina) | 0.2 | Urethane resin | 25 | 40 | 25 | 40 | 3.6 |
| Example 6 | FIG. 2(c) upper face is affixed | 1.8 | Urethane resin + thermally conductive fillers (boron nitride and alumina) | 0.2 | Urethane resin | 25 | 45 | 25 | 45 | 6.4 |
| Comparative Example 1 | Graphite sheet | Graphite sheet 1950 (W/m · K) | | | | 25 | 25 | 25 | 25 | 0 |
| Comparative Example 2 | None | — | | | | 75 | 75 | 75 | 75 | 0 |

It was found that in the thermally conductive adhesive sheets of the present invention used in Examples 1 to 6, compared with the Comparative Examples, the temperature difference between the high thermally conductive portions and the adjacent low thermally conductive portions was large. In addition, it was found that when the thermally conductive adhesive sheets of the present invention were applied to thermoelectric conversion devices, large output was obtained.

INDUSTRIAL APPLICABILITY

Particularly when the thermally conductive adhesive sheet of the present invention is affixed to the thermoelectric conversion module of a thermoelectric conversion device, one of electronic devices, a temperature difference can be efficiently provided in the thickness direction of the thermoelectric elements, and therefore power generation with high power generation efficiency is possible, and the number of installed thermoelectric conversion modules can be decreased compared with conventional types, leading to downsizing and cost reduction. In addition, at the same time, by using the thermally conductive adhesive sheet of the present invention, a flexible type thermoelectric conversion device can be used without the installation place being limited; for example, it is installed in a waste heat source or a heat dissipation source having an uneven face.

REFERENCE SIGNS LIST 1, 1A, 1B: thermally conductive adhesive sheet
2: adherend
4, 4a, 4b: high thermally conductive portion
5, 5a, 5b: low thermally conductive portion
6: temperature difference measurement portion
10: thermoelectric conversion device
11: P-type thermoelectric element
12: N-type thermoelectric element
13: electrode (copper)
14a, 14b: high thermally conductive portion
14'a, 14'b, 14'c: high thermally conductive portion
15a, 15b, 15c: low thermally conductive portion
15'a, 15'b: low thermally conductive portion
16: thermoelectric conversion module
17: first face of 16
18: second face of 16
19: support
20: thermoelectric conversion device
21: P-type thermoelectric element
22: N-type thermoelectric element
23a, 23b, 23c: electrode (copper)
24: high thermally conductive portion
25: low thermally conductive portion
26: support
27: thermoelectric conversion module
28: lower face of 27
29: upper face of 27
41: P-type thermoelectric element
42: N-type thermoelectric element
43: electrode (copper)
44: film-shaped substrate
45: film-shaped substrate
46: thermoelectric conversion module
47, 48: material having low thermal conductivity (polyimide)
49, 50: material having high thermal conductivity (copper)
51, 52: low thermal conductivity member
53: thermoelectric element 54: electrode (copper)
55: electrically conductive adhesive layer
56: insulating adhesive layer
61: thermoelectric element
62: flexible substrate
63: metal layer (copper)
64: resin layer
65: insulating substratum layer
66: flexible substrate
67: adhesive layer

The invention claimed is:

1. A thermally conductive adhesive sheet comprising a high thermally conductive portion and a low thermally conductive portion,
wherein the high thermally conductive portion and the low thermally conductive portion have adhesiveness, and the high thermally conductive portion and the low thermally conductive portion each independently constitute an entire thickness of the thermally conductive adhesive sheet, or at least either the high thermally conductive portion or the low thermally conductive portion constitutes a portion of a thickness of the thermally conductive adhesive sheet,
wherein a thermal conductivity of the high thermally conductive portion is 0.5 (W/m·K) or more and 2000 (W/m·K) or less, and a thermal conductivity of the low thermally conductive portion is less than 0.5 (W/m·K),
wherein the high thermally conductive portion and the low thermally conductive portion are each formed of an adhesive resin composition, and
wherein the adhesive resin composition of the high thermally conductive portion comprises at least one of silica, alumina, magnesium oxide, a metal nitride, copper, and aluminum.

2. The thermally conductive adhesive sheet according to claim 1, wherein each adhesive resin composition comprises at least one of a thermosetting resin and an energy ray-curable resin.

3. The thermally conductive adhesive sheet according to claim 2, wherein each adhesive resin composition comprises at least said thermosetting resin and wherein the thermosetting resin is a silicone resin or a urethane resin.

4. The thermally conductive adhesive sheet according to claim 1, wherein the adhesive resin composition of the high thermally conductive portion comprises said metal nitride and said alumina.

5. The thermally conductive adhesive sheet according to claim 4, wherein the metal nitride is at least one of silicon nitride, aluminum nitride, magnesium nitride, and boron nitride.

6. The thermally conductive adhesive sheet according to claim 4, wherein the adhesive resin composition of the high thermally conductive portion comprises boron nitride and said alumina.

7. The thermally conductive adhesive sheet according to claim 1, wherein the thermal conductivity of the high thermally conductive portion of the thermally conductive adhesive sheet is 1.0 (W/m·K) or more and 2,000 (W/m·K) or less, and the thermal conductivity of the low thermally conductive portion is less than 0.5 (W/m·K).

8. An electronic device comprising the thermally conductive adhesive sheet according to claim 1.

9. A method for producing the thermally conductive adhesive sheet according to claim 1, comprising forming on a release sheet a high thermally conductive portion having a thermal conductivity of 0.5 (W/m·K) or more and 2000 (W/m·K) or less and formed of an adhesive resin composition and a low thermally conductive portion having a thermal conductivity less than 0.5 (W/m·K) and formed of an adhesive resin composition.

10. The thermally conductive adhesive sheet according to claim 1, wherein the thermal conductivity of the high thermally conductive portion is 1.0 (W/m·K) or more and 500 (W/m·K) or less, and the thermal conductivity of the low thermally conductive portion is 0.15 (W/m·K) or more and less than 0.5 (W/m·K).

11. The thermally conductive adhesive sheet according to claim 1, wherein the thermal conductivity of the high thermally conductive portion is 1.0 (W/m·K) or more and 500 (W/m·K) or less, and the thermal conductivity of the low thermally conductive portion is 0.15 (W/m·K) or more and 0.3 (W/m·K) or less.

12. The thermally conductive adhesive sheet according to claim 1, wherein the thermal conductivity of the high thermally conductive portion is 1.3 (W/m·K) or more and 500 (W/m·K) or less, and the thermal conductivity of the low thermally conductive portion is 0.15 (W/m·K) or more and 0.3 (W/m·K) or less.

13. The thermally conductive adhesive sheet according to claim 1, wherein the thermal conductivity of the high thermally conductive portion is 1.3 (W/m·K) or more and 500 (W/m·K) or less, and the thermal conductivity of the low thermally conductive portion is 0.15 (W/m·K) or more and 0.25 (W/m·K) or less.

14. The thermally conductive adhesive sheet according to claim 1, wherein at least either the high thermally conductive portion or the low thermally conductive portion constitutes a portion of a thickness of the thermally conductive adhesive sheet.

15. The thermally conductive adhesive sheet according to claim 10, wherein the high thermally conductive portion and the low thermally conductive portion each independently constitute an entire thickness of the thermally conductive adhesive sheet.

16. The thermally conductive adhesive sheet according to claim 10, wherein at least either the high thermally conductive portion or the low thermally conductive portion constitutes a portion of a thickness of the thermally conductive adhesive sheet.

17. The thermally conductive adhesive sheet according to claim 1, wherein the high thermally conductive portion and the low thermally conductive portion each independently constitute an entire thickness of the thermally conductive adhesive sheet, and wherein the thermal conductivity of the low thermally conductive portion is 0.15 (W/m·K) or more and less than 0.5 (W/m·K).

18. The thermally conductive adhesive sheet according to claim 1, wherein at least either the high thermally conductive portion or the low thermally conductive portion constitutes a portion of a thickness of the thermally conductive adhesive sheet, and wherein the thermal conductivity of the low thermally conductive portion is 0.15 (W/m·K) or more and less than 0.5 (W/m·K).

19. The thermally conductive adhesive sheet according to claim 1, wherein the adhesive resin composition of the high thermally conductive portion comprises at least one of said silica, said alumina, said magnesium oxide, and said metal nitride.

20. The thermally conductive adhesive sheet according to claim 19, wherein the metal nitride is at least one of silicon nitride, aluminum nitride, magnesium nitride, and boron nitride.

* * * * *